(12) United States Patent
Amrany et al.

(10) Patent No.: US 6,351,185 B1
(45) Date of Patent: Feb. 26, 2002

(54) INCREASED OUTPUT SWING LINE DRIVERS FOR OPERATION AT SUPPLY VOLTAGES THAT EXCEED THE BREAKDOWN VOLTAGE OF THE INTEGRATED CIRCUIT TECHNOLOGY

(75) Inventors: Daniel Amrany, Ocean Township; Frode Larsen, Tinton Falls; Arnold Muralt, Fair Haven, all of NJ (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/637,748

(22) Filed: Aug. 11, 2000

Related U.S. Application Data
(60) Provisional application No. 60/149,062, filed on Aug. 16, 1999.

(51) Int. Cl.[7] .................................................. H03F 3/45
(52) U.S. Cl. ........................ 330/253; 330/146; 330/261
(58) Field of Search ................................. 330/146, 253, 330/261

(56) References Cited

U.S. PATENT DOCUMENTS

| | | | | |
|---|---|---|---|---|
| 3,495,223 A | * | 2/1970 | Martin, Jr. .................. | 330/146 |
| 3,530,391 A | * | 9/1970 | Goordman .................. | 330/146 |
| 5,847,600 A | * | 12/1998 | Brooks et al. .............. | 330/253 |
| 6,025,742 A | * | 2/2000 | Chan .......................... | 330/253 |
| 6,087,899 A | * | 7/2000 | Kubota ....................... | 330/253 |

* cited by examiner

*Primary Examiner*—Benny Lee
*Assistant Examiner*—Khanh Van Nguyen
(74) *Attorney, Agent, or Firm*—Thomas, Kayden, Horstemeyer & Risley (57) ABSTRACT

An improved line driver and method for increasing the available signal transmit power on a transmission line are disclosed. The improved line driver achieves an available transmit power increase without increasing the maximum current in the line driver output stage. The output stage of the line driver may comprise a first amplifier, a second amplifier, and an integrated back-matching resistor network. In order to further increase the available transmit power; a protective semiconductor device may be added to a line driver output stage for each semiconductor device in the first and second amplifiers. A third embodiment of a line driver output stage in accordance with the present invention may comprise a combination of the integrated back-matching resistor network along with the protective semiconductor devices. In its broadest terms, the method for increasing the available signal transmit power on a transmission line of the present invention can be described as: applying a transmit signal to an input stage of an integrated line driver; amplifying the transmit signal such that the output signal swing exceeds the maximum drain-source voltage of the integrated circuit technology used to implement the line driver amplifier(s); and applying the amplified transmit signal via an integrated back-matching resistor network to the transmission line.

44 Claims, 7 Drawing Sheets

INCREASED OUTPUT SWING LINE DRIVERS FOR OPERATION AT SUPPLY VOLTAGES THAT EXCEED THE BREAKDOWN VOLTAGE OF THE INTEGRATED CIRCUIT TECHNOLOGY

CROSS-REFERENCE TO RELATED APPLICATION

The present application claims the benefit of U.S. provisional patent application, issued serial No. 60/149,062, and filed Aug. 16, 1999, which is hereby incorporated by reference in its entirety.

FIELD OF THE INVENTION

The present invention generally relates to high-speed data communications. More specifically, the invention relates to an improved integrated line driver, which solves problems associated with integration density, power efficiency, and the need for transmitted signal swings in excess of the breakdown voltage of the selected semiconductor technology.

BACKGROUND OF THE INVENTION

With the advancement of technology, and the need for instantaneous information, the ability to transfer digital information from one location to another, such as from a central office (CO) to a customer premise (CP) has become more and more important.

Figure 1:
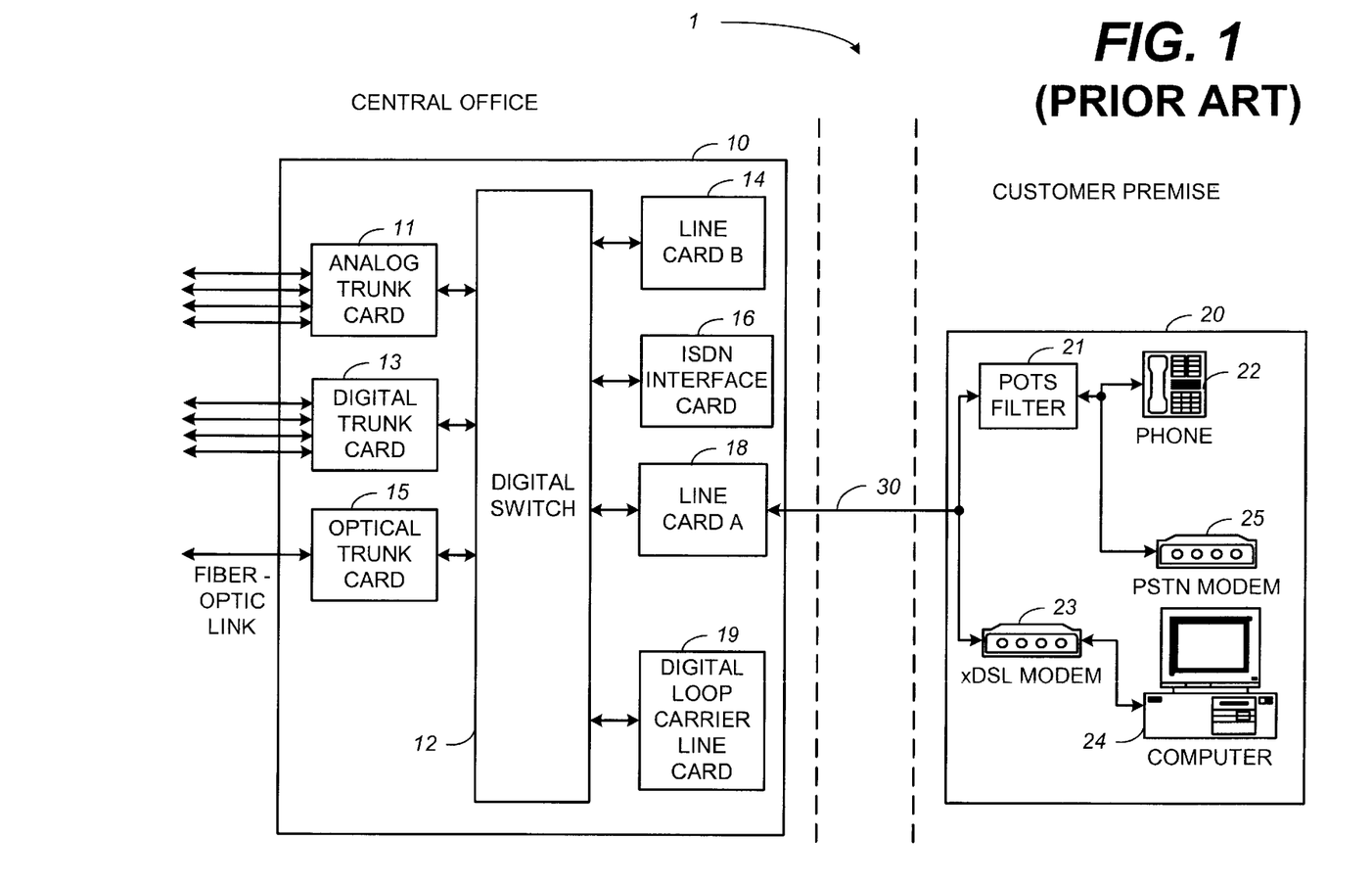
FIG. 1 is a prior art block diagram illustrating a xDSL communications system between a CO and a CP.

In a digital subscriber line (DSL) communication system, data is transmitted from a CO to a CP via a transmission line, such as a two-wire twisted pair, and is transmitted from the CP to the CO as well, either simultaneously or in different communication sessions. The same transmission line might be utilized for data transfer by both sites or the transmission to and from the CO might occur on two separate lines. In this regard reference is now directed to FIG. 1, which illustrates a prior art xDSL communication system 1. Specifically, FIG. 1 illustrates communication between a central office (CO) 10 and a customer premise (CP) 20 by way of twisted-pair telephone line 30. While the CP 20 may be a single dwelling residence, a small business, or other entity, it is generally characterized as having plaint old telephone system (POTS) equipment, such as a telephone 22, a public switched telephone network (PSTN) modem 25, a facsimile machine (not shown), etc. The CP 20 may also include an xDSL communication device, such as an xDSL modem 23 that may permit a computer 24 to communicate with one or more remote networks via the CO 10. When a xDSL service is provided, a POTS filter 21 might be interposed between the POTS equipment 22 and the twisted-pair telephone line 30. As is known, the POTS filter 21 includes a low-pass filter having a cut-off frequency of approximately 4 kilohertz to 10 kilohertz, in order to filter high frequency transmissions from the xDSL communication device 23 and to protect the POTS equipment.

At the CO 10, additional circuitry is provided. Generally, a line card (i.e., Line Card A) 18 containing line interface circuitry is provided for electrical connection to the twisted-pair telephone line 30. In fact, multiple line cards 14, 18 may be provided to serve a plurality of local loops. In the same way, additional circuit cards are typically provided at the CO 10 to handle different types of services. For example, an integrated services digital network (ISDN) interface card 16, a digital loop carrier line card 19, and other circuit cards, for supporting similar and other communication services, may be provided.

A digital switch 12 is also provided at the CO 10 and is configured to communicate with each of the various line cards 14, 16, 18, and 19. On the outgoing side of the CO (i.e., the side opposite the various local loops), a plurality of trunk cards 11, 13, and 15 are typically provided. For example, an analog trunk card 11, a digital trunk card 13, and an optical trunk card 15 are illustrated in FIG. 1. Typically, these circuit cards have outgoing lines that support numerous multiplexed DSL service signal transmissions.

Figure 2:
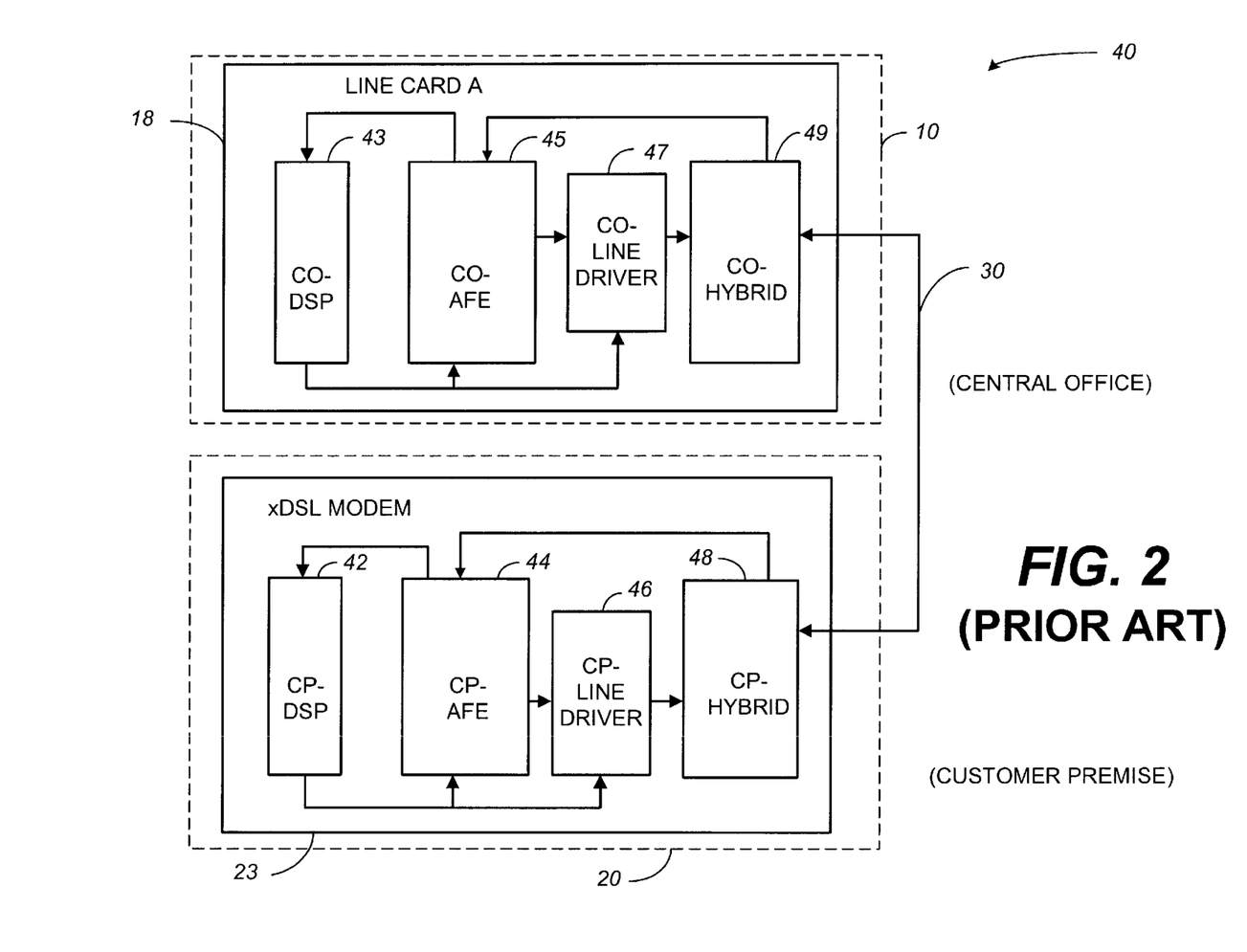
FIG. 2 is a prior art block diagram illustrating a xDSL communication link used in the xDSL communication system of FIG. 1 between a line card and a xDSL modem.

Having introduced a conventional xDSL communication system 1 as illustrated and described in relation to FIG. 1, reference is now directed to FIG. 2, which is a prior art functional block diagram illustrating the various elements in a xDSL communications link 40 between a line card 18 located within a CO 10 and a xDSL modem 23 located at a CP 20. In this regard, the xDSL communications link 40 of FIG. 2 illustrates transmission of data from a CO 10 to a CP 20 via a transmission line 30, such as, a twisted-pair telephone transmission line as may be provided by a POTS service provider to complete a designated link between a CO 10 and a CP 20. In addition, FIG. 2 further illustrates the transmission of data from the CP 20 to the CO 10 via the same twisted-pair telephone transmission line 30. With regard to the present illustration, transmission of data may be directed from the CP 20 to the CO 10, from the CO 10 to the CP 20 or in both directions simultaneously. Furthermore, data transmissions can flow on the same twisted-pair telephone transmission line 30 in both directions, or alternatively on separate transmission lines (one shown for simplicity of illustration). Each of the separate transmission lines may be designated to carry data transfers in a particular direction either to or from the CP 20.

The CO 10 may include a printed circuit line card 18 (see FIG. 1) that includes a CO-digital signal processor (DSP) 43, which receives digital information from one or more data sources (not shown) and sends the digital information to a CO-analog front end (AFE) 45. The CO-AFE 45 interposed between the twisted-pair telephone transmission line 30 and the CO-DSP 43 may convert digital data, from the CO-DSP 43, into a continuous time analog signal for transmission to the CP 20 via the one or more twisted-pair telephone transmission lines 30.

One or more analog signal representations of digital data streams supplied by one or more data sources (not shown) may be converted in the CO-AFE 45 and further amplified and processed via a CO-line driver 47 before transmission by a CO-hybrid 49, in accordance with the amount of power required to drive an amplified analog signal through the twisted-pair telephone transmission line 30 to the CP 20. A CP-hybrid 48, located at the CP 20, may then be used to de-couple a received signal from the transmitted signal in accordance with the data modulation scheme implemented by the particular xDSL data transmission standard in use. The CP-AFE 44, located at the CP 20, having received the de-coupled received signal from the CP-hybrid 48, may then convert the received analog signal into a digital signal, which may then be transmitted to a CP-DSP 42 located at the CP 20. Finally, the digital information may be further transmitted to one or more specified data sources such as the computer 24 (see FIG. 1).

In the opposite data transmission direction, one or more digital data streams supplied by one or more devices in communication with the CP-DSP 42 at the CP 20 may be converted by the CP-AFE 44 and further amplified via CP-line driver 46. As will be appreciated by those skilled in the art, the CP-line driver 46 may amplify and forward the transmit signal with the power required to drive an amplified analog signal through the twisted-pair telephone transmission line 30 to the CO 10. It is significant to note that the CP-hybrid 48 is used to regenerate the transmit signal so it may be subtracted from the receive signal when the DSL is receiving. As a result, the CP-hybrid 48 does not affect the transmitted signal in any way. The CO-AFE 45 may receive the data from the CO-hybrid 49, located at the CO 10, which may de-couple the signal received from the CP 20 from the signal transmitted by the CO 10. The CO-AFE 45 may then convert the received analog signal into one or more digital signals, which may then be forwarded to the CO-DSP 43 located at the CO 10. Finally, the digital information may be further distributed to one or more specified data sources (not shown) by the CO-DSP 43.

Figure 3:
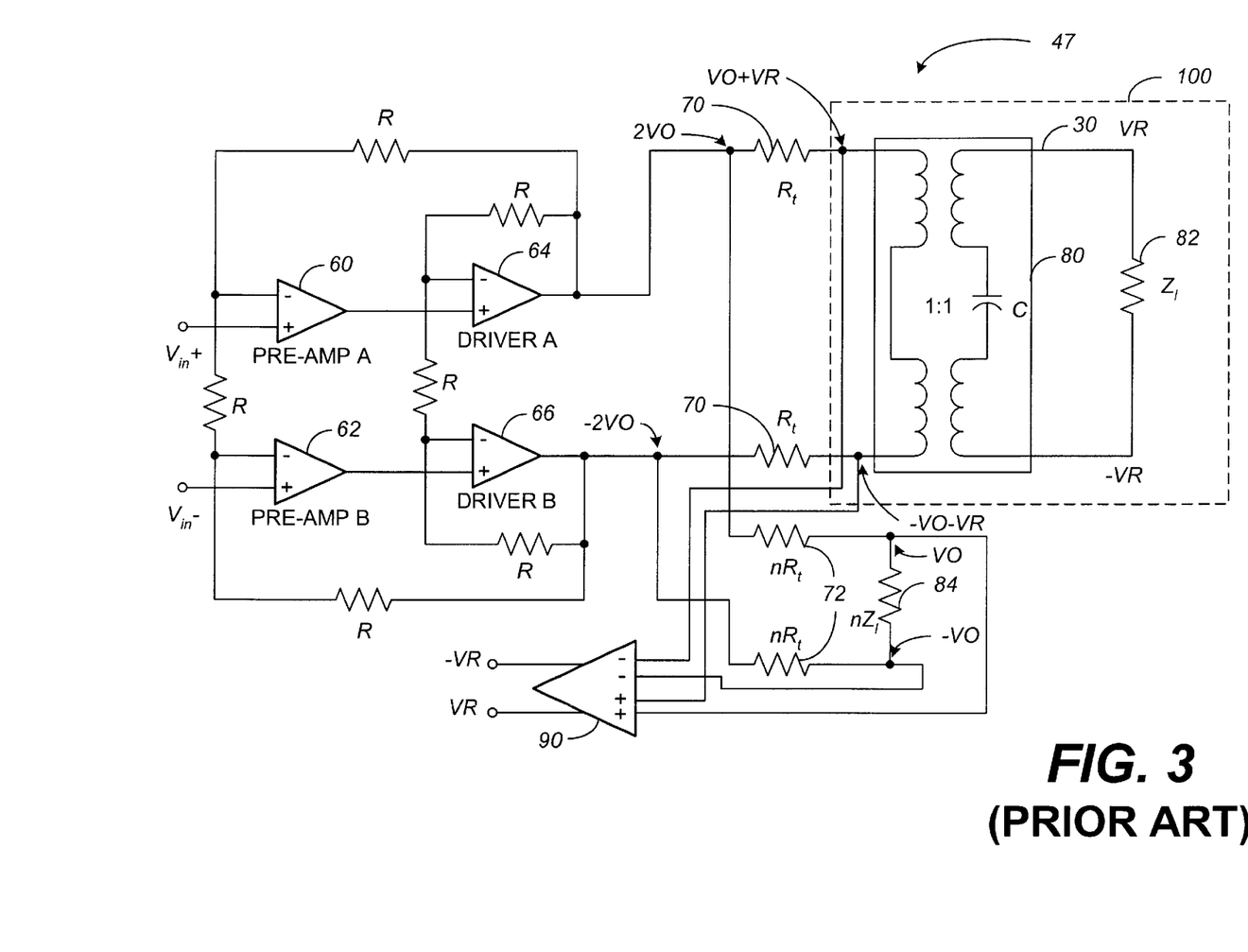
FIG. 3 is a prior art circuit schematic of a conventional line driver that may be used to complete the xDSL communication link of FIG. 2.

Having briefly described a xDSL communications link 40 between the line card 18 located within the CO 10 and the xDSL modem 23 located at the CP 20 as illustrated in FIG. 2, reference is now directed to FIG. 3. In this regard, FIG. 3 is a prior art circuit schematic for a conventional line driver 47. In communication systems designed to transmit data over metallic transmission lines, the line driver is an amplifier which delivers the energy required to transmit the intended signal to the line via a back-matching resistor. Often impedance and voltage scaling is performed by coupling the output from the line driver amplifiers to the transmission line via a transformer.

The back-matching resistor 70 serves two purposes. First, the back-matching resistor 70 serves to match the impedance 82 at the end of the transmission line 30. In order to provide a sufficient return loss, a resistor approximately equal to the line's characteristic impedance 82 must terminate the line. Second, the back-matching resistor 70 permits the line driver 47 to simultaneously receive signals generated from a remote transmitter coupled to the transmission line 30 at the same time the line driver 47 is transmitting. The line driver 47 cannot terminate the transmission line 30 alone because the line driver 47 presents a low impedance to the remotely transmitted signal. The remotely transmitted signal is recovered by subtracting from the voltage on the transmission line 30 the voltage introduced on the transmission line 30 by the local transmitter. A hybrid amplifier 90 performs the task of separating and recovering the remotely transmitted signal from the transmission line. Each of these elements is present in the circuit schematic of a prior art conventional line driver 47 as illustrated in FIG. 3.

As illustrated in FIG. 3, the input to the conventional line driver 47 is fed into the input of a pre-amplifier stage, herein illustrated by pre-amp A 60 and pre-amp B 62. The pre-amplifier stage then feeds the high-power driver amplifiers, designated driver A 64 and driver B 66. The pre-amplifier stage, if implemented via complementary metal oxide semiconductor (CMOS) technology, would have nearly infinite input impedance. The outputs of the high-power driver amplifiers 64, 66 are loaded by the back-matching resistors, herein designated $R_t$ 70, in series with the impedance presented by the primary of the line transformer. For simplicity, a transformer with a 1:1 turns ratio is illustrated, thus making the impedance looking into the primary equivalent to the line impedance labeled $Z_l$ 82.

As illustrated in FIG. 3, the outputs of the high-power driver amplifiers 64, 66 are fed to a scaled version of the load via back-matching resistors, herein designated $nR_t$ 72 and an emulated line impedance, $nZ_l$ 84 in addition to being coupled to a load 100. The load 100 may comprise the transformer 80, the twisted-pair telephone transmission line 30, and a load impedance, herein designated $Z_l$ 82. The transmit signal generated across the emulated line impedance, $nZ_l$ 84, is subtracted from the combined receive and transmit voltage appearing at the primary of the transformer by a hybrid amplifier 90. As further illustrated in FIG. 3, the output of the hybrid amplifier 90, VR−(−VR) should comprise the received signal from a remotely located transmitter after the transmit signal has been subtracted, or 2VR. The back-matching resistors 70 emulate the impedance of the transmission line load as seen looking into the primary of a transformer 80. For simplicity, the transformer 80 illustrated in the circuit of FIG. 3 is a 1:1 transformer 80, in which $R_t$ 70 is equal to ½ $Z_l$.

It is important to note that one-half of the output voltage signal swing will be present across the two back-matching resistors, $R_t$ 70. This is true independent of the transformer 80 winding ratio. The impedance is only matched if the sum of the back-matching resistors, $R_t$ 70 equals the line impedance $Z_l$ 82, which limits the power and voltage efficiency of a conventional CMOS line driver to less than 50%. Only 50% of the power delivered by the line driver is actually delivered to the transmission line 30, while half is dissipated in the back-matching resistors 70.

Figure 4:
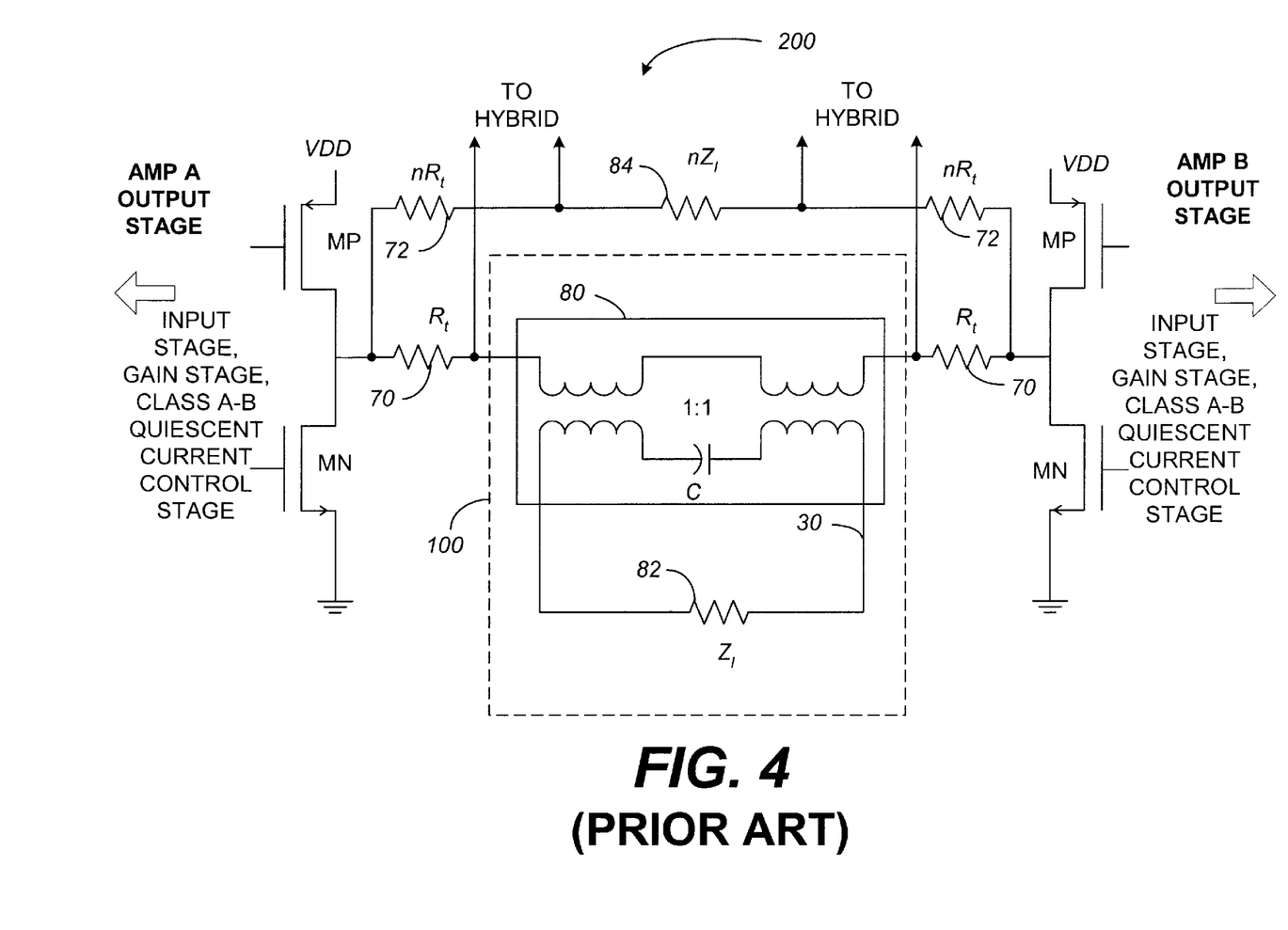
FIG. 4 is a prior art circuit schematic of an output stage of a CMOS line driver.

Having briefly described the operation of a conventional prior art line driver 47 as illustrated in the circuit schematic of FIG. 3, reference is now directed to FIG. 4, which illustrates a detailed view of the output stage of a CMOS line driver 200. For ease of illustration and discussion, the pre-amplifier and high-power gain stages, the class A–B control stage, the hybrid matching network and the hybrid amplifier all typical elements of a line driver are not illustrated. Those skilled in the art will appreciate and understand the operation and implementation of the circuitry required to realize the omitted portions of the line driver 47 and the hybrid 49. The focus of FIG. 4 is on the core output stage of a prior art CMOS line driver 200.

As illustrated in FIG. 4, the output stage of a conventional CMOS line driver 200 may comprise a pair of PMOS (MP) and NMOS (MN) devices herein designated as AMP A and AMP B. The PMOS device may source current from a power supply (not shown) into the load 100, while the NMOS device on the other side of the transformer 80 sinks the same current from the load 100 into ground. The preceding stage, not shown in this simplified schematic, performs the input sensing, amplification, and the class A–B quiescent current crossover control for the illustrated output devices. The class A–B control typically limits the current drawn from the non-active device to a significantly smaller value than the maximum in order to increase efficiency. If class B operation is assumed with ideal devices, implying no bleed current for the non-active device, the maximum single-ended signal swing across the transformer 80 will be −½ VDD, the supply voltage.

Further assuming that AMP A is sourcing the load 100 current and AMP B is sinking an equivalent load 100 current, a voltage potential maximum of VDD may be realized at the drain of the MP device of AMP A and voltage ground at the drain of the MN device of AMP B. Since $Z_l$ is $2R_t$ a simple voltage division of 2 is realized looking at the transformer 80 and one-half of the supply voltage, VDD will be applied across the primary of the transformer 80. Reversing the polarity, −½VDD will be applied across the primary of the transformer 80 for a maximum peak-to-peak voltage of VDD.

With real devices, the actual maximum signal swing is significantly smaller. Typical values for 5 Volt CMOS line drivers are about 6 Vpp out of the driver, or 3 Vpp on the line. Current CMOS line drivers operated with a 5-Volt power supply are unable to deliver the maximum power required for several higher power xDSL applications. The peak currents required using the conventional CMOS output driver 200 for various xDSL communication standards may be identified using the following formula:

$$I_p = \frac{PAR^2}{V_p} * 10^{(PWR/10)}, \qquad \text{Eq. 1}$$

where $I_p$ is the peak current in mA, PAR is the peak-to-average ratio for the coding method associated with the xDSL standard, PWR is the power delivered to the line in dBm, and $V_p$ is the single-ended peak voltage across the primary of the transformer 80. If 3 Vpp is applied across the transmission line, the required peak current for HDSL2 (16.8 dBm pulse amplitude modulation (PAM); PAR=3.8) would be 461 mA. If the same 3 Vpp is applied across the transmission line, the required peak current for ADSL-CP (12.5 dBm discrete multi-tone (DMT); PAR=5.1) would be 308 mA. Likewise, the required peak current for ADSL-CO (20.5 dBm DMT; PAR=5.1) would be 1945 mA, clearly beyond the capability of currently available conventional 5 Volt CMOS line drivers, as conventional 5 Volt CMOS line drivers have a maximum output current typically in the 100 mA through 350 mA range. However, if the effective output signal swing, $V_p$, is increased, the required current would scale inversely, which would enable the delivery of proportionally more power over the twisted-pair telephone transmission line 30 (see FIGS. 1 and 2).

Increasing the effective output signal swing creates significant problems for semiconductor devices. Semiconductor devices can be designed to withstand higher supply voltages by altering diffusion profiles of semiconductor dopants across the various materials comprising each device. However, modifying the diffusion profiles across the device inherently alters the operating characteristics of the device, generally resulting in much slower devices. Any gains in transmitted power are significantly offset due to the lower maximum operating rate of the modified devices. In addition, altering diffusion profiles of semiconductor devices to permit larger supply voltages is not very attractive for economic reasons. Such a processing modification entails significant development and manufacturing costs to realize a new family of semiconductor devices. Furthermore, modification of diffusion profiles for output stage devices requires the development of a suite of new computer models for designing circuits using the new devices.

Accordingly, there is a need for a line driver that can be realized with standard CMOS devices that is capable of operating at power supply voltages that exceed the breakdown voltage of the CMOS output stage devices in order to meet the maximum power requirements for most xDSL applications.

SUMMARY OF THE INVENTION

In light of the foregoing, the invention is a circuit and a method for constructing a line driver capable of driving a communications line with a transmitted signal having an output voltage swing in excess of the breakdown voltage of the selected integrated circuit technology. The improved line driver architecture of the present invention provides increased output voltage swing without sacrificing the speed of the technology by modifying the amplifier topology to handle the higher supply voltage. It also does not require any costly processing modifications, as conventional 5-Volt CMOS integrated circuit manufacturing processes can be utilized. It is significant to note that the circuits illustrated hereinbelow, in an effort to best illustrate the present invention, are presented by way of example only. For ease of illustration and description, CMOS devices are used exclusively throughout the various circuits. Those skilled in the art will recognize that the teachings of the present invention will readily apply to other semiconductor technologies as well.

In a preferred embodiment, an improved output stage of a line driver may comprise a first amplifier, a second amplifier, a load, and a plurality of integrated back-matching resistors. By integrating the back-matching resistors in the configuration presented below with regard to FIG. 5, the CMOS line driver may support an increase in the effective signal swing across the transformer that may yield a power increase from 2.5 dB to 3.0 dB.

In a second preferred embodiment, an improved output stage of a line driver may comprise a first amplifier, a second amplifier, integrated back-matching resistors, and a load, wherein both the first and the second amplifiers are supply voltage protected through the addition of protective semiconductor devices in series with the respective amplifier devices. In this particular example, a switched source follower is added in series with both the first and second amplifiers to distribute an increased supply voltage drop appropriately across the improved line driver output stage. With this approach it is possible to double the supply voltage to 10 Volts for standard CMOS devices. Thus, an improved line driver consistent with the teachings of the second preferred embodiment can be expected to yield a 6.0 dB increase in maximum power while sourcing the same maximum current.

A third preferred embodiment comprises a combination of the integrated back-matching resistors and the protective semiconductor devices to support a further increase in the line driver supply voltage. A line driver consistent with the teachings of the third embodiment may be expected to realize an 8.5 to 9.0 dB increase in the maximum power available for data transmission.

The present invention can also be viewed as providing a method for increasing the available signal transmit power along a transmission line. In its broadest terms, the method can be described as: applying a transmit signal to an input stage of an integrated line driver; amplifying the transmit signal such that the output signal swing exceeds the maximum drain-source voltage of the integrated circuit technology used to implement the line driver amplifier(s); and applying the amplified transmit signal via an integrated back-matching resistor network to the transmission line.

A design approach consistent with the teachings of the present invention utilizes standard semiconductor devices even though they are intended for operation with supply voltages that exceed the breakdown voltage associated with the corresponding semiconductor device technology. As a result, special models are not required to simulate line driver circuit variations. Furthermore, various line drivers consistent with the present invention may be constructed of readily available standard integrated circuits. This approach represents a significantly more cost-effective approach to implementing high voltage line drivers. First, the semiconductor devices may be more uniform and may have tighter operational tolerances. In addition, the semiconductor devices will be less expensive as a special manufacturing process will not have to be developed to construct integrated devices that can handle higher power supply voltages.

Other features and advantages of the present invention will become apparent to one skilled in the art upon examination of the following drawings and detailed description. It is intended that all such additional features and advantages be included herein within the scope of the present invention, as defined by the claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION OF THE PREFERRED EMBODIMENT

Figure 5:
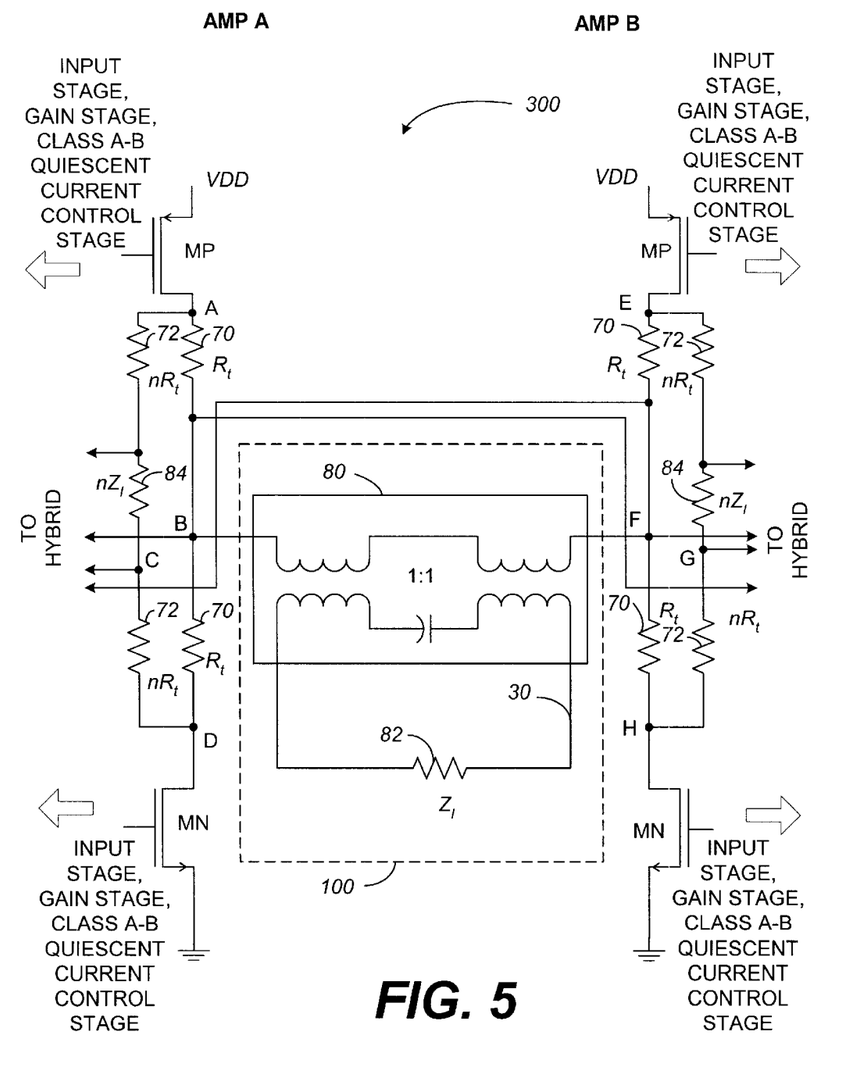
FIG. 5 is a circuit schematic of a first embodiment of an improved output stage of a CMOS line driver in accordance with the present invention.

Turning now to the drawings illustrating the present invention, wherein like reference numerals designate corresponding parts throughout the drawings, FIG. 5 illustrates a circuit schematic of an improved output stage of a CMOS line driver in accordance with the present invention. In this regard, an improved output stage of a CMOS line driver 300 may comprise a first amplifier, AMP A, a second amplifier, AMP B, a load 100, and integrated back-matching resistors 70, 72. The load 100 may comprise the transformer 80, the twisted-pair telephone transmission line 30, and may be characterized by a load impedance, herein designated $Z_l$ 82.

Looking back to the conventional line driver architecture illustrated in FIG. 3, the line driver 47 produces peak differential voltages of 2VO. The line impedance $Z_l$ 82 is equal to $2R_t$ and half of the transmit signal may be applied across the primary of the transformer 80. In addition, the primary of the transformer 80 may see the receive signal making the total voltage at the input to the load 100 VO+VR at one terminal of the 200 of FIG. 4, the maximum output voltage is equal to the supply voltage assuming theoretical devices and perfect class A–B operation. For the improved output stage of a CMOS line driver 300 of FIG. 5, the output voltage is reduced by a factor of 1/3. If standard 5 Volt CMOS devices are used in the circuit, the voltage supply may be increased to 20/3 Volts assuming the same maximum supply voltage may be applied across the active semiconductor devices of AMP A and AMP B. It is significant to note that the voltage across the semiconductor device of either AMP A or AMP B that is off may see the maximum drain-source voltage. Assuming that AMP A is sourcing current and AMP B is sinking current, the MP device of AMP A would be a short circuit, as would the MN device of AMP B. Following the current path from AMP A to AMP B, the voltage at node A would be 20/3 Volts, node B would see 15/3 Volts, node F would see 5/3 Volts, and node H would see ground or 0 Volts. Similarly, for a signal of the opposite polarity, the voltage at node E would be 20/3 Volts, node F would see 15/3 Volts, node B would see 5/3 Volts, and node D would see electrical ground or 0 Volts. The maximum voltage ever seen between any two terminals of any of the CMOS devices of AMP A and AMP B is 5 Volts. To enable subsequent subtraction of the transmit signal by the hybrid network and the hybrid amplifier 90 (see FIG. 3), the back-matching resistors $R_t$ 70 and $nR_t$ 72 may be integrated. Thus, terminals B and F may see the entire voltage comprising both the transmit and receive signals, while terminals C and G may see the transmit signal only, which may be used to recover the receive signal from the hybrid amplifier 90 (see FIG. 3).

In this way, the effective signal swing across the transformer 80 may increase from 2.5 Volts to 10/3 Volts, yielding a power increase of 2.5 dB conservatively. The power increase assumes no loss in available output signal swing as the transmit signal approaches the maximum supply voltage. Typically, the maximum attainable output swing for a CMOS line driver 47 is limited to a certain voltage difference from the power supply voltage. As the power supply voltage is increased, the improved output stage of a CMOS line driver 300 may utilize a larger portion of the supply voltage than previous conventional CMOS line drivers. As a result, the practical power gain by using the approach illustrated in FIG. 5 should be closer to 3 dB.

When integrating the back-matching resistors 70, 72 as illustrated in FIG. 5, however, there is a dependence on manufacturing process variation in the resistance values of the various integrated back-matching resistors 70, 72. For some xDSL applications with stringent return loss specifications, the approach may be hit or miss given the realizable variance in the integrated resistors using a particular semiconductor device manufacturing process. As previously stated, the return loss is directly proportional to how closely the sum of the resistances of the back-matching resistors 70, 72 reflect the actual line impedance 82. If the manufacturing process resistance tolerances are too large, the resulting return loss may be unacceptable. However, for most xDSL applications, the return loss is not a significant limitation and the circuit illustrated in FIG. 5 may be used to significantly increase the output power delivered to a transmission line 30.

Figure 6:
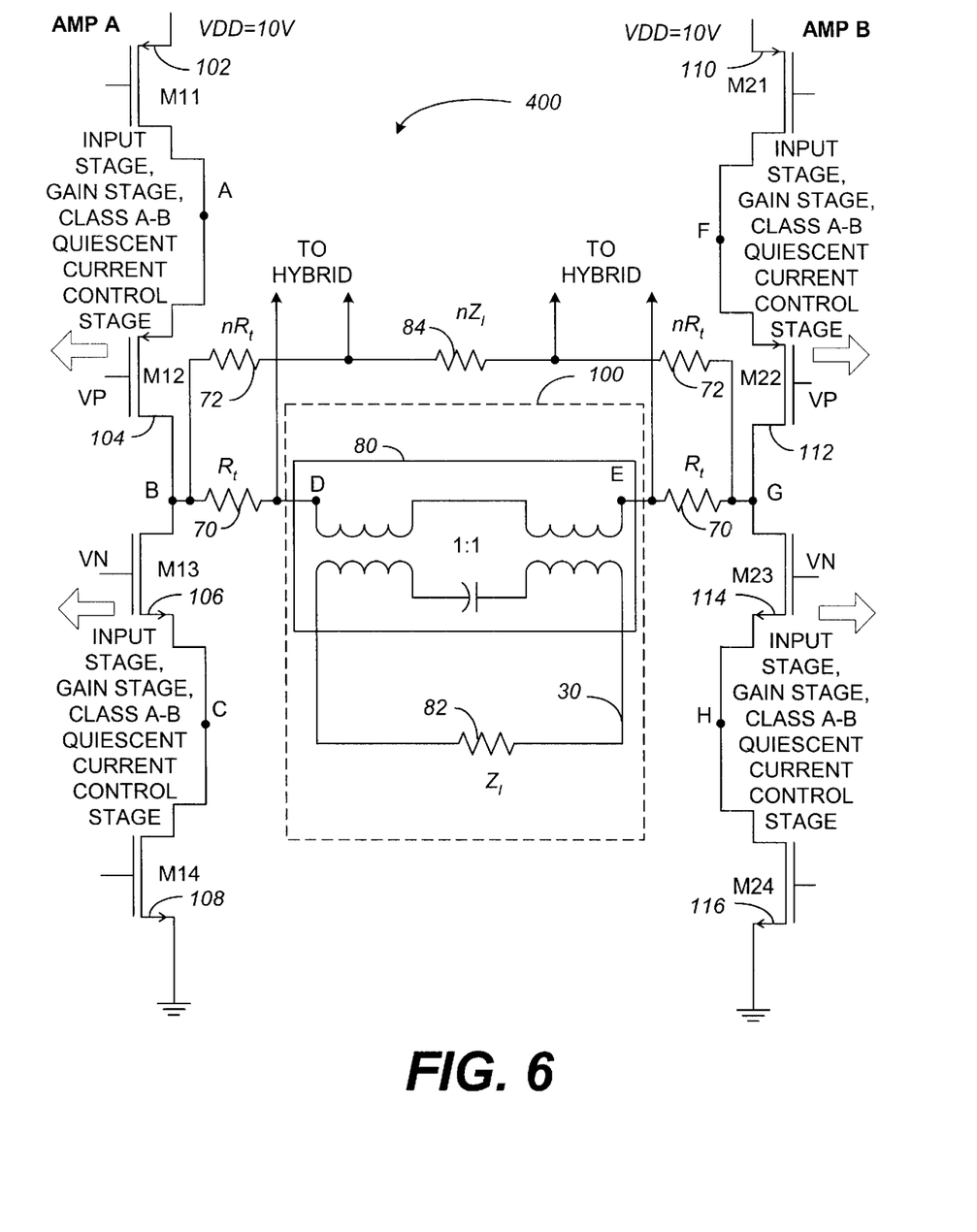
FIG. 6 is a circuit diagram of a second embodiment of an improved output stage of a CMOS line driver in accordance with the present invention.

Having introduced and described a first embodiment of an improved output stage of a CMOS line driver 300 in accordance with the present invention with regard to FIG. 5, reference is now directed to FIG. 6. In this regard, FIG. 6 illustrates a circuit diagram depicting a second alternative embodiment of an improved output stage of a CMOS line driver in accordance with the present invention. As illustrated in FIG. 6, an improved output stage of a CMOS line driver 400 may comprise a first amplifier, AMP A, a second amplifier, AMP B, a load 100, and integrated back-matching resistors 70, 72. The load 100 may comprise the transformer 80, the twisted-pair telephone transmission line 30, and may be characterized by a load impedance, herein designated $Z_l$ 82.

Both the first amplifier, AMP A, and the second amplifier, AMP B, may comprise a plurality of semiconductor devices. As illustrated in FIG. 6, AMP A may comprise a series combination of PMOS and NMOS devices. Proceeding from VDD at the top of FIG. 6 to ground, AMP A may comprise PMOS devices M11 102 and M12 104, as well as, NMOS devices M13 106 and M14 108. Similarly, AMP B may comprise PMOS devices M21 110 and M22 112, as well as, NMOS devices M23 114 and M24 116. As illustrated in FIG. 6, two back-matching resistors herein designated $R_t$ 70 may be coupled between the primary of the transformer 80 and nodes B and G on each of the respective amplifiers AMP A and AMP B disposed between the series combination of PMOS 102, 104, 110, 112 and NMOS devices 106, 108, 114, 116.

As further illustrated in FIG. 6, a parallel and scaled resistive load comprising a pair of resistors $nR_t$ 72, and a third resistor $nZ_l$ 84 may be added to provide the various differential voltage inputs to the hybrid amplifier 90 (see FIG. 3). The high-power driver amplifiers 64, 66 drive two parallel loads, a first load comprising the back-matching resistors $R_t$ 70 and the line impedance 82 and the second load comprising the scaled resistive load. If n is selected such that it is relatively large, the additional load as seen by the high-power driver amplifiers 64, 66 will be insignificant. The receive signal is coupled through the transformer 80 and is added to the transmit signal across the line impedance $Z_l$ 82. The transmit signal is present across both the $nZ_l$ 84 and the $Z_l$ 82 impedances. Thus, if signals across the back-matching resistors 70, 72 are subtracted (as shown in Eq. 2 and in FIG. 3), the receive signal remains at the output of the hybrid amplifier 90.

As also illustrated in FIG. 6, the added series devices of the circuit of FIG. 6 (in comparison with the circuit of FIG. 5) will pick up the excess supply voltage when the output device is inactive, thus preventing break down. The added series devices will function as a closed switch when the output device is active. The circuit of FIG. 6 illustrates one possible approach to protecting the semiconductor devices of AMP A and AMP B from an increased supply voltage. The added series devices act as source followers when the first and second amplifier devices are inactive and shorted switches (closed) when the first and second amplifier devices are active. If Amp A is sourcing the output current and Amp B is sinking the output current the drain of M11 102 would go high closing the M12 device as a switch and the drain of M24 116 would go low closing M23 114 as a switch. Assuming a threshold voltage of 1 Volt for both the PMOS and NMOS devices 102, 104, 106, 108, 110, 112, 114, 116; with no current supplied to the transformer 80; and with VN and VP tied to 5 Volts, to further illustrate the operation of the circuit of FIG. 6, the voltage at node A and node F may be approximately 6 Volts. Progressing down each of the first amplifier AMP A and the second amplifier AMP B, nodes B and G may both see approximately 5 Volts. Nodes C and H may both see approximately 4 Volts. In standard fashion, the previous stages (not shown for ease of illustration) adjust the gate voltages of devices M11 102, M14 108, M21 110, and M24 116 such that the quiescent current through both amplifier branches is the intended value as controlled by the class A–B control loop. The middle devices, herein designated M12 104, M13 106, M22 112, and M23 114 may function as a second gain stage with a drain to source voltage of 1 Volt (as assumed above). However, since the value of the load is very small, the effective gain is negligible and stability would still be achieved. In order to drive node B, the gate voltage of M11 102 may be driven down to supply the required current. This drives node A higher; M12 104 may then be overdriven and may function as a PMOS switch. With the voltage at node B getting closer to VDD, this is not a problem since the drain of M12 104 may be higher than 5 Volts and the difference between any device terminals may remain less than or equal to 5 Volts.

Looking at the NMOS devices within AMP A, the class A–B quiescent current control loop (not shown) may keep a minimum current through the bottom two NMOS devices M13 106 and M14 108 in order to maintain class A–B operation. Device M13 106 may have a slight current going through it, maintaining the voltage at node C close to 4 Volts. Thus unless terminal B rises above 9 Volts, the voltage difference between adjacent terminals of the four devices may not exceed 5 Volts. It is important to note that by biasing VP at 4 Volts and VN at 6 Volts and maintaining the assumption of a fixed gate to source voltage of 1 Volt for the source followers, the circuit of FIG. 6 may utilize the entire supply range.

Stated in another way to further illustrate operation of the improved output stage of a CMOS line driver 400, the operation of the output devices will not be impeded by the additional protection devices M12 104 and M23 114 as these act as switches when the output devices are active. For the inactive devices M21 110 and M22 112 for Amp B and M13 106 and M14 108 for Amp A, respectively, output device M21 is protected by the source follower M22 112 and M14 108 is protected by the source follower M13 106. The protection devices M12 104 and M23 114 will keep the minimum voltage at the drain node of M21 110 slightly above VP and the maximum voltage at the drain of M14 108 slightly below VN regardless of the output voltage.

With this approach, it is possible to double the supply voltage to 10 Volts for standard CMOS devices. Thus, the improved output stage of a CMOS line driver 400 as illustrated in FIG. 6 can be expected to yield a 6 dB increase in maximum power with the same maximum current.

It is further important to note that a plurality of configurations may be utilized to protect the semiconductor devices that are not delivering current in an improved line driver in accordance with the present invention. The circuit of FIG. 6 illustrates but one method to protect the idle semiconductor device. The scheme illustrated in FIG. 6 protects the idle devices by inserting a switched source follower in series to distribute the required voltage drop appropriately. Alternatively, a plurality of switched source followers may be added as required in order to handle supply voltages greater than twice the breakdown voltage of the selected semiconductor technology.

Figure 7:
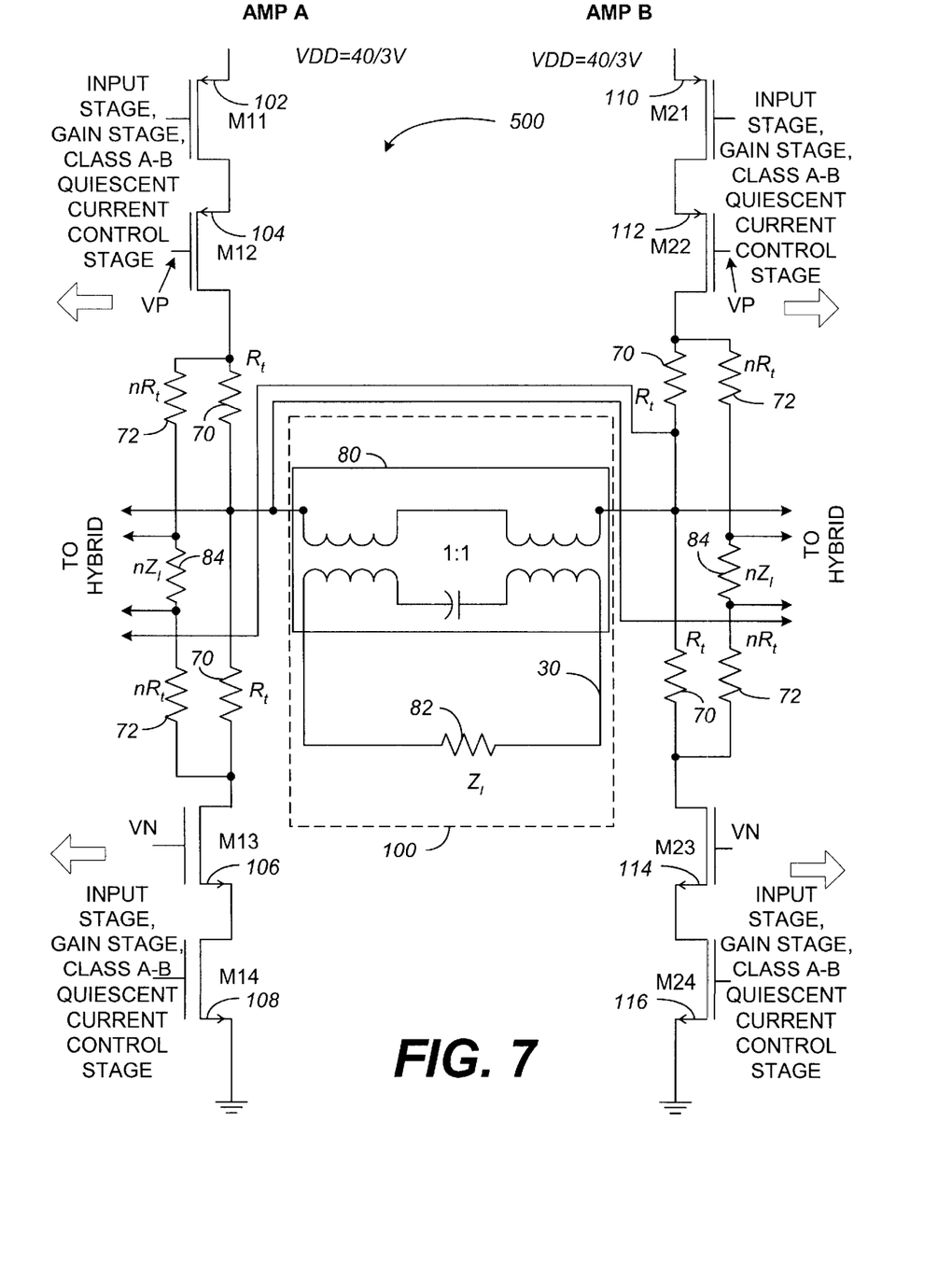
FIG. 7 is a circuit diagram of a third embodiment of an improved output stage of a CMOS line driver comprising a combination of the improvements introduced within the first and second embodiments as illustrated in FIGS. 5 and 6.

Having introduced and described both a first embodiment of an improved output stage of a CMOS line driver 300 in accordance with regard to FIG. 5, as well as, a second improved output stage of a CMOS line driver 400 with regard to FIG. 6, reference is now directed to FIG. 7. In this regard, FIG. 7 illustrates a third preferred embodiment of an improved output stage of a CMOS line driver in accordance with the present invention. FIG. 7 is a circuit diagram illustrating an improved output stage of a CMOS line driver comprising a combination of the improvements of the first and second embodiments as illustrated in FIGS. 5 and 6. Specifically, the third preferred embodiment of an improved line driver may comprise both a plurality of integrated back-matching resistors and a plurality of protective semiconductor devices.

As illustrated in FIG. 7, an improved output stage of a CMOS line driver 500 may comprise a first amplifier, AMP A, a second amplifier, AMP B, a load 100, and integrated back-matching resistors 70, 72. The load 100 may comprise the transformer 80, the twisted-pair telephone transmission line 30, and may be characterized by a load impedance, herein designated $Z_l$ 82.

Both the first amplifier, AMP A, and the second amplifier, AMP B, may comprise a plurality of semiconductor devices. As illustrated in FIG. 7, AMP A may comprise a series combination of PMOS and NMOS devices with a network comprising a plurality of integrated back-matching resistors 70, 72 interposed there between. Proceeding from VDD at the top of FIG. 7 to ground, AMP A may comprise PMOS devices M11 102 and M12 104, a series combination of back-matching resistors, $R_t$ 70 in parallel with a second series of combination of back-matching resistors, $nR_t$ 72, with the parallel back-matching resistor network in series with NMOS devices M13 106 and M14 108. Similarly, AMP B may comprise PMOS devices M21 110 and M22 112, a series combination of back-matching resistors, $R_t$ 70 in parallel with a second series of combination of back-matching resistors, $nR_t$ 72, with the parallel back-matching resistor network in series with NMOS devices M23 114 and M24 116.

As further illustrated in FIG. 7, a hybrid amplifier 90 (see FIG. 3) may be supplied with differential voltages coupled to the primary of the transformer 80 with two of the inputs further coupled to a node between the series combination of back-matching resistors $R_t$ 70. Furthermore, two back-matching resistors, herein designated $R_t$ 70, may be coupled between the primary of the transformer 80 and the corresponding inputs of the hybrid amplifier 90 (not shown). In addition, a second set of back-matching resistors comprising a scaled version of the load, herein designated $nR_t$ 72, may be coupled in series with the combination further coupled in parallel with the back-matching resistors $R_t$ 70. The hybrid amplifier 90 (see FIG. 3) may be supplied with differential voltages coupled to a node between the series combination of back-matching resistors $nR_t$ 72. It is significant to note that this circuit architecture is mirrored for AMP B.

By combining the integrated back-matching resistors 70, 72 of the first preferred embodiment with the switched source followers M12 104, M13 106, M22 112, and M23 114 introduced in the second embodiment, the improved line driver output stage of the third embodiment can support a supply voltage of 8/3 times larger than the nominal maximum supply voltage for the semiconductor technology. As a result, the improved output stage of a CMOS line driver 500 may support a maximum supply voltage of 40/3 Volts. This yields roughly an 8.5 dB increase in the maximum power with the same maximum current and saturation voltages as seen by each of the semiconductor devices 102, 104, 106, 108, 110, 112, 114, and 116. It should also be noted that reducing the maximum gate-to-source voltage for the output device may enable the designer to use shorter channel devices, as line driver output drivers then would otherwise be possible. Typically, the minimum channel length for integrated output devices is kept below the minimum value of the technology due to electrostatic discharge (ESD) and "hot" electron effect limitations.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. An output stage for a line driver, comprising:
   a first amplifier comprising a series combination of a first semiconductor device and a second semiconductor device;
   a second amplifier comprising a series combination of a third semiconductor device and a fourth semiconductor device;
   a first integrated back-matching resistor network interposed between the first and the second semiconductor devices, wherein the first integrated back-matching resistor network comprises a series combination of integrated resistors having an additive resistance selected to match an expected load input impedance; and
   a second integrated back-matching resistor network interposed between the third and the fourth semiconductor devices, wherein the second integrated back-matching resistor network comprises a series combination of integrated resistors having an additive resistance selected to emulate an expected line input impedance, wherein the second integrated back-matching resistor network is configured in parallel with the first integrated back-matching resistor network.

2. The line driver of claim 1, wherein a supply voltage applied to a source node of the first and second semiconductor devices of the first and second amplifiers respectively, is increased to a voltage level exceeding the maximum drain-source voltage for the semiconductor device technology associated with the first and second semiconductor devices, resulting in an available maximum power increase at the line driver output.

3. The line driver of claim 2, wherein the available maximum power increase at the line driver output is realizable without increasing the maximum current in the line driver output stage.

4. The line driver of claim 2, wherein the first, second, third, and fourth semiconductor devices are standard CMOS devices.

5. The line driver of claim 4, wherein the first and third semiconductor devices are PMOS transistors.

6. The line driver of claim 4, wherein the second and fourth semiconductor devices are NMOS transistors.

7. The line driver of claim 4, wherein the standard CMOS devices have a maximum drain-source voltage of approximately 5 Volts.

8. The line driver of claim 7, wherein the power supply maximum voltage is approximately 20/3 Volts.

9. The line driver of claim 8, wherein the effective signal swing across a load is approximately 10/3 Volts.

10. The line driver of claim 8, wherein the effective power gain available at the output of the line driver is greater than approximately 2.5 dB larger than the effective power gain of a conventional line driver.

11. The line driver of claim 10, wherein the effective power gain available at the output of the line driver is approximately 3.0 dB larger than the effective power gain of a conventional line driver.

12. An output stage for a line driver, comprising:
   a first amplifier comprising a series combination of a first semiconductor device and a second semiconductor device;

a second amplifier comprising a series combination of a third semiconductor device and a fourth semiconductor device;

a first integrated back-matching resistor interposed between the first and the second semiconductor devices and a first line driver output node;

a second integrated back-matching resistor interposed between the third and the fourth semiconductor devices and a second line driver output node;

a first supply voltage protective semiconductor device interposed in series between the first semiconductor device and the first integrated back-matching resistor;

a second supply voltage protective semiconductor device interposed in series between the first integrated back-matching resistor and the second semiconductor device;

a third supply voltage protective semiconductor device interposed in series between the third semiconductor device and the second integrated back-matching resistor; and a fourth supply voltage protective semiconductor device interposed in series between the second integrated back-matching resistor and the fourth semiconductor device.

13. The line driver of claim 12, wherein the sum of the resistance values of the first and the second integrated back-matching resistors is selected to match an expected load input impedance.

14. The line driver of claim 12, wherein the first and second supply voltage protective semiconductor devices comprise at least one source follower.

15. The line driver of claim 12, wherein the first and second supply voltage protective semiconductor devices protect only a respective semiconductor device that is idle.

16. The line driver of claim 13, wherein the first and second integrated back-matching resistors have a resistance of approximately the same value.

17. The line driver of claim 16, wherein a supply voltage is increased to a voltage level exceeding the maximum drain-source voltage for the semiconductor device technology associated with the first, second, third, and fourth semiconductor devices, resulting in an available maximum power increase at the line driver output.

18. The line driver of claim 17, wherein the available maximum power increase at the line driver output is realizable without increasing the maximum current in the line driver output stage.

19. The line driver of claim 18, wherein the power supply maximum voltage is approximately twice the maximum drain-source voltage of the semiconductor device technology of the first, second, third, and fourth semiconductor devices.

20. The line driver of claim 12, wherein the first, second, third, and fourth semiconductor devices are standard CMOS devices.

21. The line driver of claim 20, wherein the standard CMOS devices have a maximum drain-source voltage of approximately 5 Volts.

22. The line driver of claim 21, wherein the power supply maximum voltage is approximately 10 Volts.

23. The line driver of claim 22, wherein the first and third semiconductor devices are PMOS transistors.

24. The line driver of claim 22, wherein the second and fourth semiconductor devices are NMOS transistors.

25. The line driver of claim 22, wherein the first and third supply voltage protective semiconductor devices are PMOS transistors.

26. The line driver of claim 22, wherein the second and fourth supply voltage protective semiconductor devices are NMOS transistors.

27. The line driver of claim 22, wherein the effective signal swing across a load is approximately equivalent to the full power supply voltage range.

28. The line driver of claim 22, wherein the effective power gain available at the output of the line driver is approximately 6.0 dB larger than the effective power gain of a conventional line driver.

29. An output stage for a line driver, comprising:

a first amplifier comprising a series combination of a first semiconductor device, a first semiconductor protective device, a second semiconductor device, and a second semiconductor protective device, wherein the first and second semiconductor protective devices are interposed between the first semiconductor device and the second semiconductor devices;

a second amplifier comprising a series combination of a third semiconductor device, a third semiconductor protective device, a fourth semiconductor device, and a fourth semiconductor protective device, wherein the third and fourth semiconductor protective devices are interposed between the third semiconductor device and the fourth semiconductor devices;

a first integrated back-matching resistor network interposed between the first semiconductor protective device and a first pole of a transformer;

a second integrated back-matching resistor network interposed between the first pole of the transformer and the second semiconductor protective device;

a third integrated back-matching resistor network interposed between the third semiconductor protective device and a second pole of the transformer; and a fourth integrated back-matching resistor network interposed between the second pole of the transformer and the fourth semiconductor protective device.

30. The line driver of claim 29, wherein the first, second, third, and fourth integrated back-matching resistor networks comprise a combination of integrated resistors having a resistance selected to match an expected load input impedance.

31. The line driver of claim 29, further comprising:

a first integrated resistor having a resistance selected to emulate an expected line input impedance interposed between the first and the second integrated back-matching resistor networks; and a second integrated resistor having a resistance selected to emulate an expected line input impedance interposed between the third and the fourth integrated back-matching resistor networks.

32. The line driver of claim 29, wherein a supply voltage applied to a source node of the first and third semiconductor devices is increased to a voltage level exceeding the maximum drain-source voltage for the semiconductor device technology associated with the first, second, third, and fourth semiconductor devices, resulting in an available maximum power increase at the line driver output.

33. The line driver of claim 32, wherein the available maximum power increase at the line driver output is realizable without increasing the maximum current in the line driver output stage.

34. The line driver of claim 33, wherein the first, second, third, and fourth semiconductor devices are standard CMOS devices.

35. The line driver of claim 34, wherein the standard CMOS devices have a maximum drain-source voltage of approximately 5 Volts.

36. The line driver of claim 34, wherein the power supply maximum voltage is approximately 40/3 Volts.

37. The line driver of claim 34, wherein the first and third semiconductor devices are PMOS transistors.

38. The line driver of claim 34, wherein the second and fourth semiconductor devices are NMOS transistors.

39. The line driver of claim 34, wherein the first and third supply voltage protective semiconductor devices are PMOS transistors.

40. The line driver of claim 34, wherein the second and fourth supply voltage protective semiconductor devices are NMOS transistors.

41. The line driver of claim 36, wherein the effective signal swing across a load is approximately 20/3 Volts.

42. The line driver of claim 36, wherein the effective power gain available at the output of the line driver is greater than approximately 8.5 dB larger than the effective power gain of a conventional line driver.

43. The line driver of claim 36, wherein the effective power gain available at the output of the line driver is approximately 9.0 dB larger than the effective power gain of a conventional line driver.

44. An integrated circuit line driver, comprising:
  means for increasing the effective output signal swing to at least a voltage level that exceeds the maximum drain-source voltage of the integrated circuit technology, wherein the means for increasing the effective output signal swing comprises:
    a plurality of protective semiconductor devices, wherein the protective semiconductor devices comprise at least one source follower and wherein the protective semiconductor devices protect a semiconductor device that is idle; and
  an integrated resistor network.

* * * * *

UNITED STATES PATENT AND TRADEMARK OFFICE
CERTIFICATE OF CORRECTION

PATENT NO. : 6,351,185 B1
DATED : February 26, 2002
INVENTOR(S) : Amrany et al.

It is certified that error appears in the above-identified patent and that said Letters Patent is hereby corrected as shown below:

Column 1,
Line 43, after "having", delete "plaint" and replace with -- plain --

Column 7,
Line 60, bold "100 VO+VR"

Column 11,
Line 57, after "kept", delete "below" and replace with -- above --

Signed and Sealed this

Third Day of September, 2002

*Attest:*

*Attesting Officer*

JAMES E. ROGAN
*Director of the United States Patent and Trademark Office*